(12) United States Patent
Zansky et al.

(10) Patent No.: US 7,952,488 B1
(45) Date of Patent: May 31, 2011

(54) METHOD AND SYSTEM FOR MONITORING LATENT FAULTS IN POWER SUPPLIES

(75) Inventors: Zoltan Zansky, Sunnyvale, CA (US); Roshan Thakur, Sunnyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 327 days.

(21) Appl. No.: 12/262,426

(22) Filed: Oct. 31, 2008

(51) Int. Cl.
G08B 23/00 (2006.01)
G08B 21/00 (2006.01)
H02J 7/00 (2006.01)

(52) U.S. Cl. .............. 340/693.1; 340/636.1; 340/650; 340/660; 320/136

(58) Field of Classification Search ........... 340/693.1, 340/636.1, 650
See application file for complete search history.

(56) References Cited

U.S. PATENT DOCUMENTS

| 5,872,460 | A | * | 2/1999 | Bennett et al. | 324/769 |
| 5,914,545 | A | * | 6/1999 | Pollersbeck | 307/131 |
| 6,465,909 | B1 | * | 10/2002 | Soo et al. | 307/52 |

* cited by examiner

*Primary Examiner* — Donnie L Crosland
(74) *Attorney, Agent, or Firm* — Suiter Swantz pc llo

(57) ABSTRACT

A method and system for monitoring latent faults in power supplies may include a variable voltage source and a logic module that may be coupled to an OR FET circuit. The monitoring system may also include comparators for measuring a voltage drop across a FET and, based upon a value of the voltage drop, may determine a latent fault, such as a short circuit or open circuit across the FET.

25 Claims, 5 Drawing Sheets

METHOD AND SYSTEM FOR MONITORING LATENT FAULTS IN POWER SUPPLIES

TECHNICAL FIELD

The present disclosure generally relates to the field of power supply systems, and more particularly to a method and system for monitoring latent faults in power supplies.

BACKGROUND

Electrical energy in the form of Alternating Current (AC) is a commonly available power source found in buildings, including homes. AC power is typically supplied by a central utility via power lines or from a physical plant that is part of a facility. However, many common devices, including electronic circuits and DC motors, utilize electrical energy in the form of Direct Current (DC), which is electrical current that flows in only one direction. Thus, it is often desirable to convert AC power to DC power.

Power supply systems convert AC power to DC power suitable for powering electrical components, also known as a load. It is often desirable to combine multiple redundant power supplies in parallel to supply a given load requirement. When power supplies are combined in parallel, the output of each power supply may be combined to produce a shared output, or common output load. When multiple power supplies are combined in parallel, reliability and efficiency for the power supply system may be improved. Redundant parallel-connected power supplies may increase reliability for the overall power supply system whereby a failure of a power supply will cause other power supplies to supply enough current for support of a maximum load. Redundant parallel-connected power supplies may include an OR FET circuit which connects the output of each power supply.

SUMMARY

The present disclosure is directed to a method and system for monitoring latent faults in power supplies. A system for monitoring latent faults may include a variable voltage source and a logic module that may be coupled to an OR FET. The monitoring system may also include comparators for measuring a voltage drop across the OR FET and, based upon a value of the voltage drop, may detect a latent fault.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
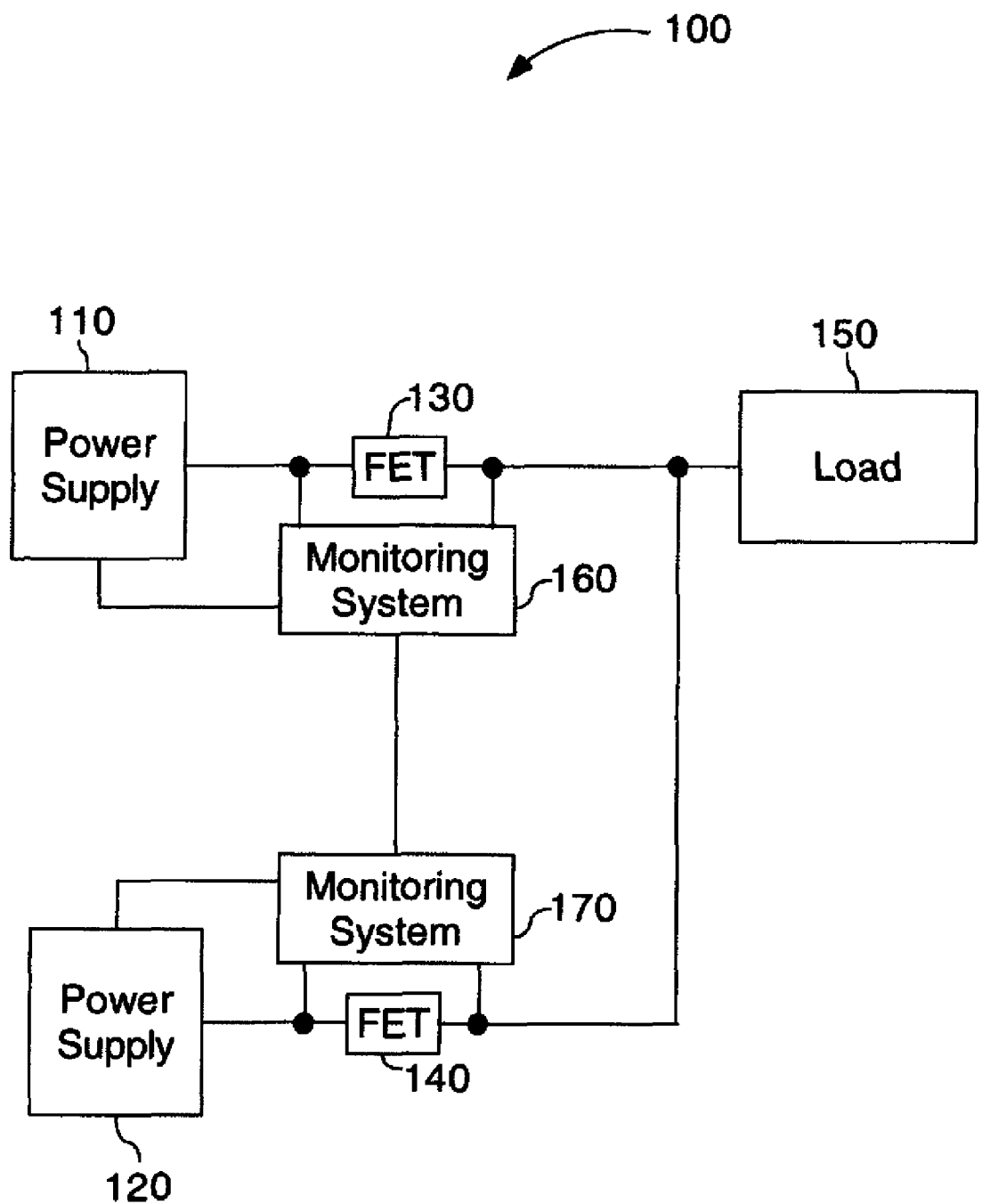
FIG. 1 is a block diagram of a power supply system.

Referring to FIG. 1, a block diagram of a power supply system 100 is shown. Power supply system 100 may include power supplies 110, 120 and may include a FET-OR circuit. A FET-OR circuit, also known as an OR FET circuit and OR FET, may be utilized in redundant power supply systems at the outputs of parallel connected power supplies to prevent a power supply with a low output voltage from drawing current from a power supply with a higher output voltage or vice versa. OR FET may provide a diode-OR function for power supply systems while reducing the voltage drop associated with conventional diode-OR connections. An OR FET may refer a field effect transistor (FET) 130, 140, such as a metal oxide semiconductor field effect transistor (MOSFET) in which the cathodes of each body diode of the FETs 130, 140 are connected to a common output of a plurality of redundant power supplies 110, 120 and anodes of each body diodes of the FET 130, 140 are coupled to the individual outputs of the individual power supplies. Each OR FET may refer to field effect transistor configured to allow operation of a body diode of the transistor to function as an OR diode and provide a logical OR function. The common output of the power supply system may be supplied to a load 150.

Monitoring system 160 may detect latent faults across FET 130 for isolating power supply 110. Monitoring system 160 may detect a short circuit condition and an open circuit condition across FET 130. Additionally, monitoring system 160 may be coupled with power supply 110, or may be integrated within power supply 110. Monitoring system 160 may signal to another power system, such as power supply 120, to notify that power supply 110 is operational and monitoring system 170 may temporarily disable FET 140 to determine if a latent fault exists. Monitoring system 170 may detect latent faults across FET 140 for isolating power supply 120. Monitoring system 170 may detect a short circuit condition or an open circuit condition across FET 140. Additionally, monitoring system 170 may be coupled with power supply 120, or may be integrated within power supply 120.

Figure 2:
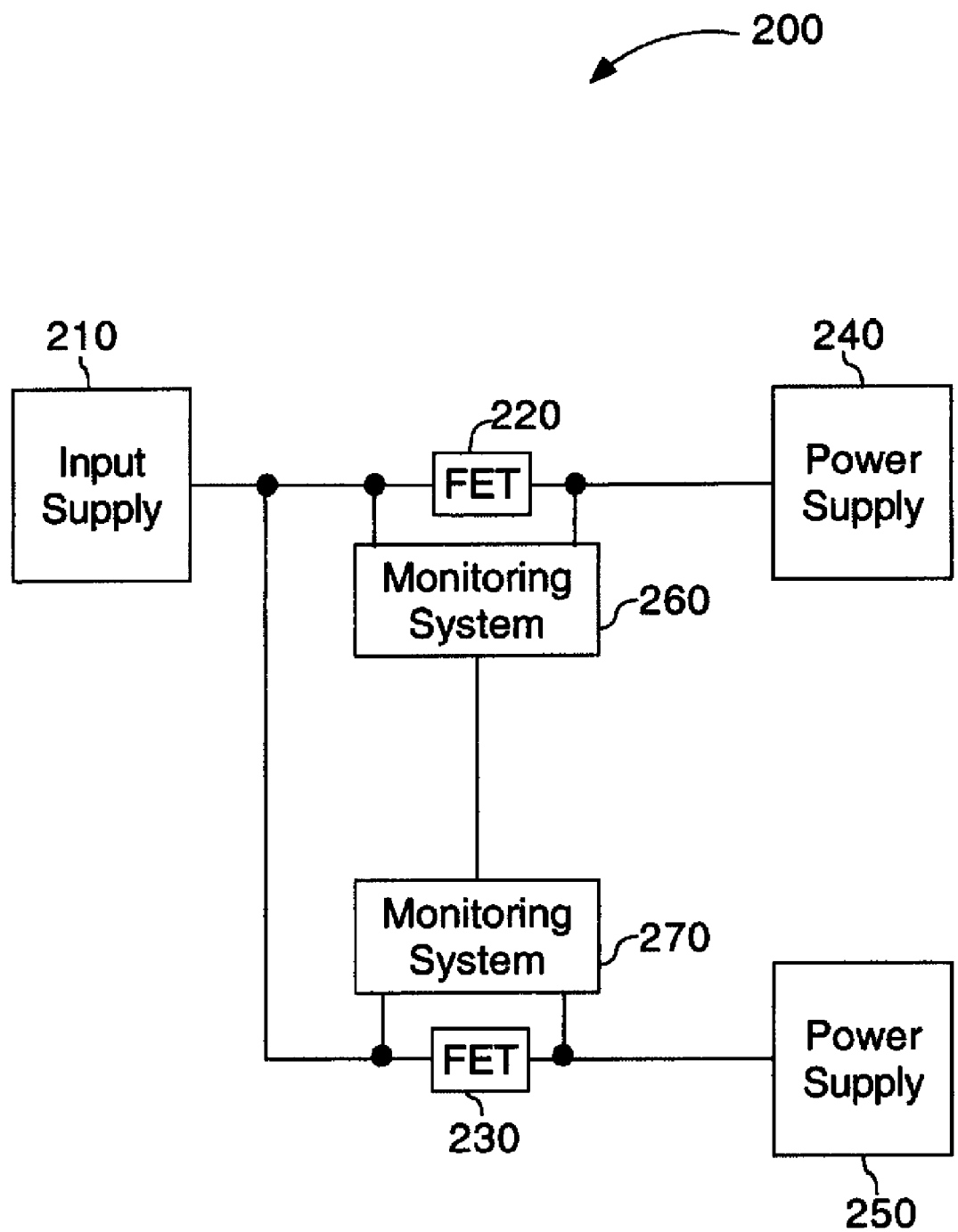
FIG. 2 is a block diagram of a power supply system in accordance with an alternative embodiment of the present disclosure.

Referring to FIG. 2, a block diagram of a power supply system 200 in accordance with an alternative embodiment of the present disclosure is shown. Power supply system 200 may include an input supply 210, which may be a DC converter and may supply a DC output. Power supplies 240, 250 may receive the output of input supply 210 and may provide a regulated DC output. Power supply system 200 may include a FET-OR circuit, also known as an OR FET. OR FET may include FET 220, 230 which may prevent reverse current flow from the power supplies 240, 250 to input supply 210 and may provide isolation for power supplies 240, 250.

Monitoring system 260 may detect latent faults across FET 220. Monitoring system 260 may detect a short circuit condition and an open circuit condition across FET 220. Monitoring system 270 may detect latent faults across FET 230. Monitoring system 270 may detect a short circuit condition and an open circuit condition across FET 230. Monitoring system 260, 270 may communicate with each other to provide alerts regarding a latent fault condition. It is contemplated that monitoring system 160, 170 of FIG. 1 and monitoring system 260, 270 may be implemented as a circuit whereby the circuit may include hardware elements and a processing unit configured for executing a program of instructions.

Power supply system 100, 200 may be subject to latent faults which may refer to a short circuit or open circuit condition of the FETs. In the instance of an open circuit of FET 130, load 150 may still receive power from the other redundant FET 140 and load 150 may be operating well and without any indication of the latent fault. This situation may exist for a long period of time without and indication of the latent fault. For example, FET 130 may suffer an open circuit condition without any indication. If power supply 120 should fail, load may not receive power even though power supply 110 may be operable due to the open circuit condition of FET 130. Additionally, a FET 130 may suffer a short circuit condition and load 150 may receive power without any indication of the latent fault. For example, if FET 130 may suffer a short circuit condition and then power supply 110 suffers a short circuit condition, an output of power supply 120 may also be shorted to ground and load 150 may not receive power. Power supply system 200 may similarly be subject to latent faults without any indication of the latent fault. Monitoring systems 160, 170 as shown and described in FIG. 1 and monitoring systems 260, 270 as shown and described in FIG. 2 may detect a latent fault condition, such as a short circuit condition and an open circuit condition, and may provide an alert.

Figure 3:
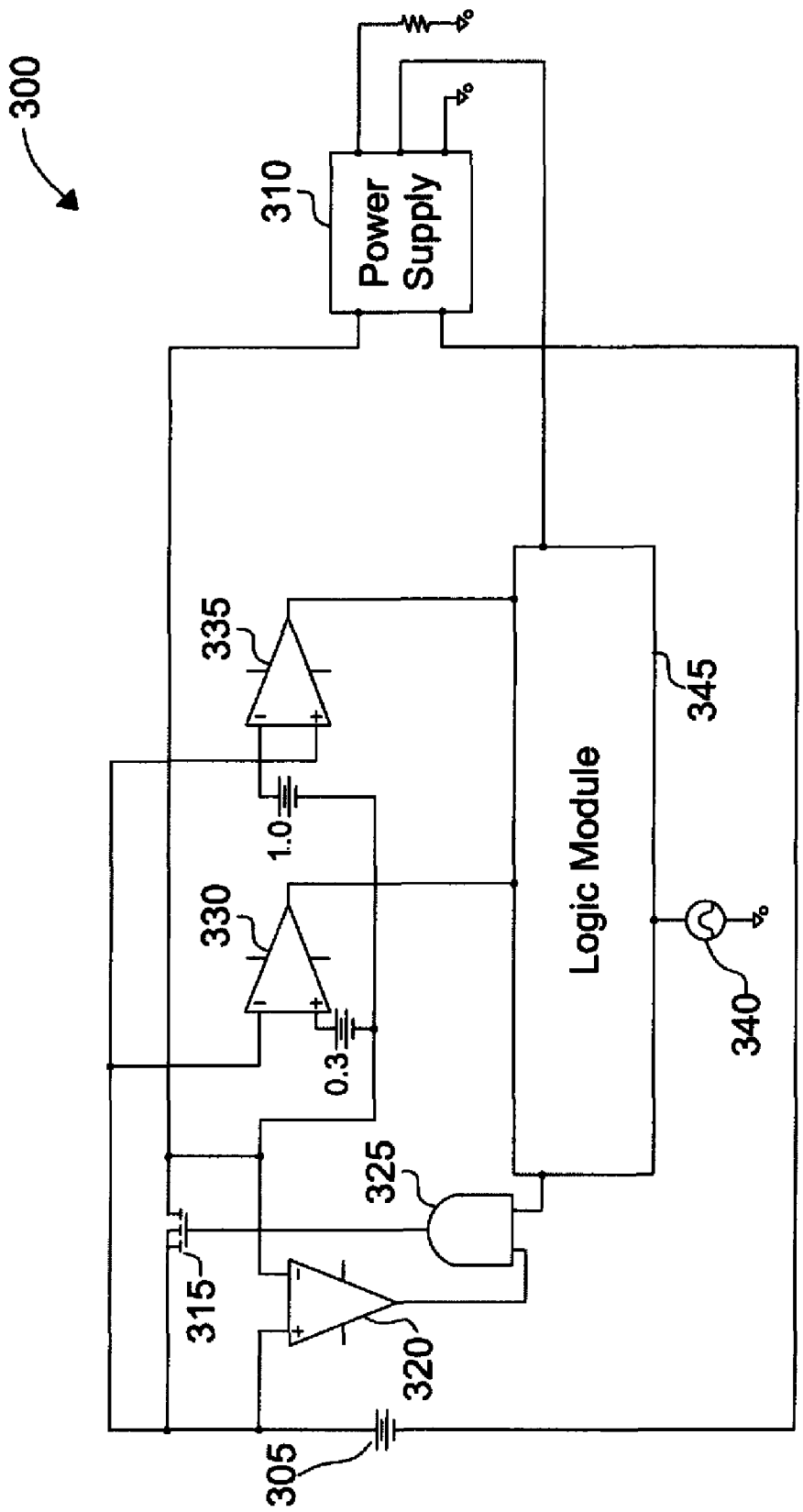
FIG. 3 is a diagram illustrating a monitoring system for detecting latent faults in a power supply system.

Referring to FIG. 3, a monitoring system 300 for detecting latent faults in a power supply system is shown. A voltage source, such as a DC voltage source 305 may power a power supply 310 through a FET OR may be implemented through the body diode of the FET transistor, such as a MOSFET 315. A body diode of a MOSFET 315 may refer to the internal diode created during fabrication of the MOSFET 315. Upon the detection of current flow from anode to cathode of the body diode, a comparator 320 may provide a gate voltage to the MOSFET 315, turning the MOSFET 315 on, which shunts the body diode of the MOSFET 315. Comparator 320 may be implemented as an operational amplifier. When the MOSFET 315 has been turned on, current may pass through it with minimal power dissipation. The power dissipation may be an amount of the drain to source current squared ($Ids^2$) times the drain to source resistance of the MOSFET (RDSon). Power supply 310 may supply a DC voltage to a load.

Monitoring system 300 may include an AND gate 325, comparators 330, 335, variable voltage source 340 and a logic module 345. Monitoring system 300 may periodically execute a test of a power supply system to ensure the power supply system is operating without any latent faults. Monitoring system 300 may operate by introducing a periodic signal to disable a MOSFET 315 and test operation of the MOSFET 315. Variable voltage source 340 may turn to a high voltage for a short time, such as 100 milliseconds (msec) and off for a long period, such as 10 or 100 hours. Additionally, variable voltage source 340 may introduce a LOGIC-high on command and may be controllable through a user interface of a system in which power supply 310 operates, such as a computing system or storage system. When a variable voltage source 340 is turned on (high), the output of AND gate 325 may be low which may disable the MOSFET 315.

Comparators 330, 335 may measure a voltage across the MOSFET 315 when the MOSFET 315 is enabled or disabled. Comparators 330, 335 may compare a voltage with a known reference voltage and may be implemented as operational amplifiers. For example, if the MOSFET 315 has a short circuit condition, comparator 330 may measure a voltage drop less than 0.3 volts when MOSFET 315 is disabled and comparator 330 may deliver a high output to logic module 345 indicating a shorted MOSFET. Additionally, if the MOSFET 315 has an open circuit condition, comparator 335 may measure a voltage drop greater than 1 volt when the MOSFET is enabled and may deliver a high output to logic module 345 indicating an open circuited MOSFET. When MOSFET 315 is operational and is not subject to a latent fault, a voltage drop may be between 0.3 volts and 1 volt and logic module 345 may not receive a high output from either of comparators 330, 335. It is contemplated that other voltage ranges may be applied to the monitoring system 300 without departing from the scope and intent of the disclosure.

When a latent fault has been detected, logic module 345 may provide a logic output LOW and may be AND-ed with a PWR-OK (power supply is operational) signal of power supply 310 in order to output a PWR-OK is not operational (a fault condition) alert to the administrator (a user). In such a fashion, an administrator may be alerted when a latent fault has been detected through the lack of an indication of a PWR-OK signal that is available through power supply 310. Alternatively, a separate latent fault warning signal (audio or visual) may be provided to the user, through power supply 310 or through a system in which the power supply is operating, such as a computing system, storage system and the like.

Logic module 345 fault signal may be coupled to a test circuit of a parallel connected power supply (not shown) to disable the test circuit of the parallel connected power supply. This may avoid dropping the power input to the load.

It is contemplated that logic module 345 may be implemented in hardware. For example, logic module 345 may comprise logic gates and registers in order to provide functionality as described above. Alternatively, logic module 345 may be implemented through a software implementation whereby a program of instructions is executed by a processing unit. Processing unit may be associated with a power supply 310.

Figure 4:
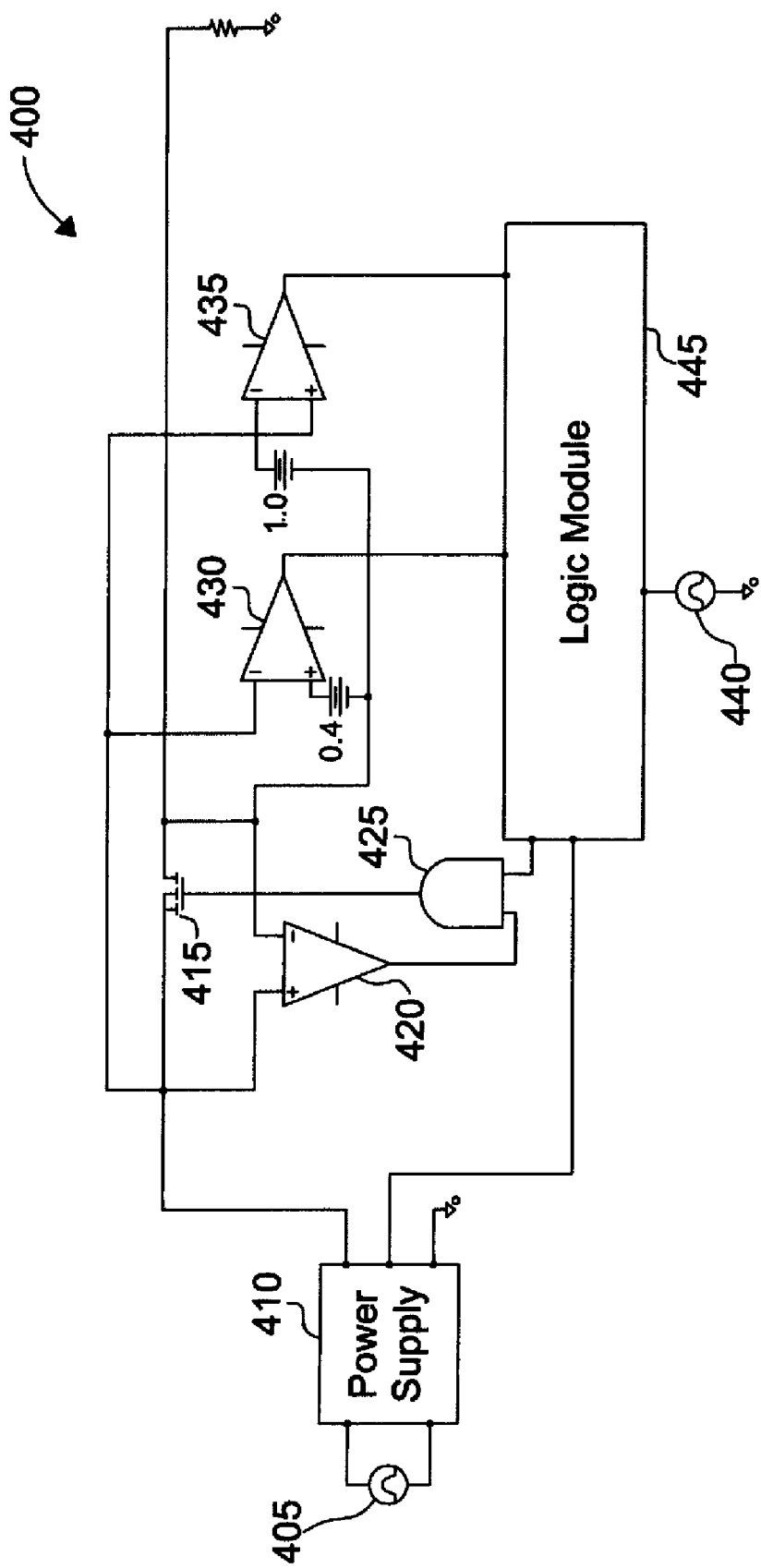
FIG. 4 is a diagram illustrating a monitoring system for detecting latent faults in a power supply system in accordance with an alternative embodiment of the present disclosure.

Referring to FIG. 4, a monitoring system 400 for detecting latent faults in a power supply system is shown. An AC voltage source 405 may supply AC power to a power supply 410, such as an AC/DC converter. Power supply 410 may provide power to a load through a FET OR circuit. A FET may be implemented with a body diode of FET, such as a MOSFET 415. A body diode of a MOSFET 415 may refer to the internal diode of the FET created during fabrication of the MOSFET 415. Upon the detection of current flow from anode to cathode of the body diode, a comparator 420 may provide a gate voltage to the MOSFET 415, turning the MOSFET 415 on. When the MOSFET 415 has been turned on, current may pass with minimal power dissipation. The power dissipation may be an amount of the drain to source current squared ($Ids^2$) times the drain to source resistance of the MOSFET 415 when on (RDSon).

Monitoring system 400 may include an AND gate 425, comparators 430, 435, variable voltage source 440 and a logic module 445. Monitoring system 400 may periodically execute a test of a power supply system to ensure the power supply system is operating without any latent faults. Monitoring system 400 may operate by introducing a periodic logic high signal of 440 which with gate 425 disable a MOSFET 415 and test operation of the MOSFET 415. Variable voltage source 440 may turn to a high voltage for a short time, such as 100 milliseconds (msec) and off for a long period, such as 10 or 100 hours. Additionally, variable voltage source 440 may introduce a high voltage on command and may be controllable through a user interface of a system in which power supply 410 operates, such as a computing system or storage system. When a variable voltage source 440 is turned on (high), the output of AND gate 425 may be low which may disable the MOSFET 415.

Comparators 430, 435 may measure a voltage across the MOSFET 415 when the MOSFET is disabled. For example, if the MOSFET has a short circuit condition, comparator 430 may measure a voltage drop less than 0.3 volts and comparator 430 may deliver a high output to logic module 445. Additionally, if the MOSFET 415 has an open circuit condition, comparator 435 may measure a voltage drop greater than 1 volt and may deliver a high output to logic module 445. When MOSFET 415 is operational and is not subject to a shorted or opened latent fault condition, a voltage drop may be between 0.3 volts and 1 volt and logic module 445 may not receive a logic fault high output from either of comparators 430, 435.

When a latent fault has been detected, logic module 445 may provide a logic output LOW and may be AND-ed with a PWR-OK (power supply is operational) signal of power supply 410 in order to alert an administrator (a user). In such a fashion, an administrator may be alerted when a latent fault has been detected through the lack of an indication of a PWR-OK signal that is available through power supply 410. Alternatively, a separate latent fault warning signal (audio or visual) may be provided to the user, through power supply 410 or through a system in which the power supply is operating, such as a computing system, storage system and the like.

Logic module 445 may be coupled to a PWR-OK signal of a parallel connected power supply (not shown). This may ensure that if the other power supply is not operational, the MOSFET 415 may not be disabled by the test and a voltage drop at a load may be avoided. Additionally, logic module 445 may be coupled with another power supply to ensure another power supply does not perform a test if the power supply 410 is not operational.

It is contemplated that logic module 445 may be implemented in a hardware. For example, logic module may comprise logic gates and registers in order to provide functionality as described above. Alternatively, logic module 445 may be implemented through a software implementation whereby a program of instructions is executed by a processing unit. Processing unit may be associated with a power supply 410.

It is contemplated that monitoring system 300, 400 may be implemented with redundant power supply systems for computing systems, storage systems and the like. Monitoring systems 300, 400 may be operably connected with a processing unit of a computing system which is locally or remotely located to the power supply system. When a latent fault has been detected, monitoring system 300, 400 may send a signal to a processing unit of the computing system. Computing system may notify a user, through an alert, error message, electronic mail communication and the like.

Figure 5:
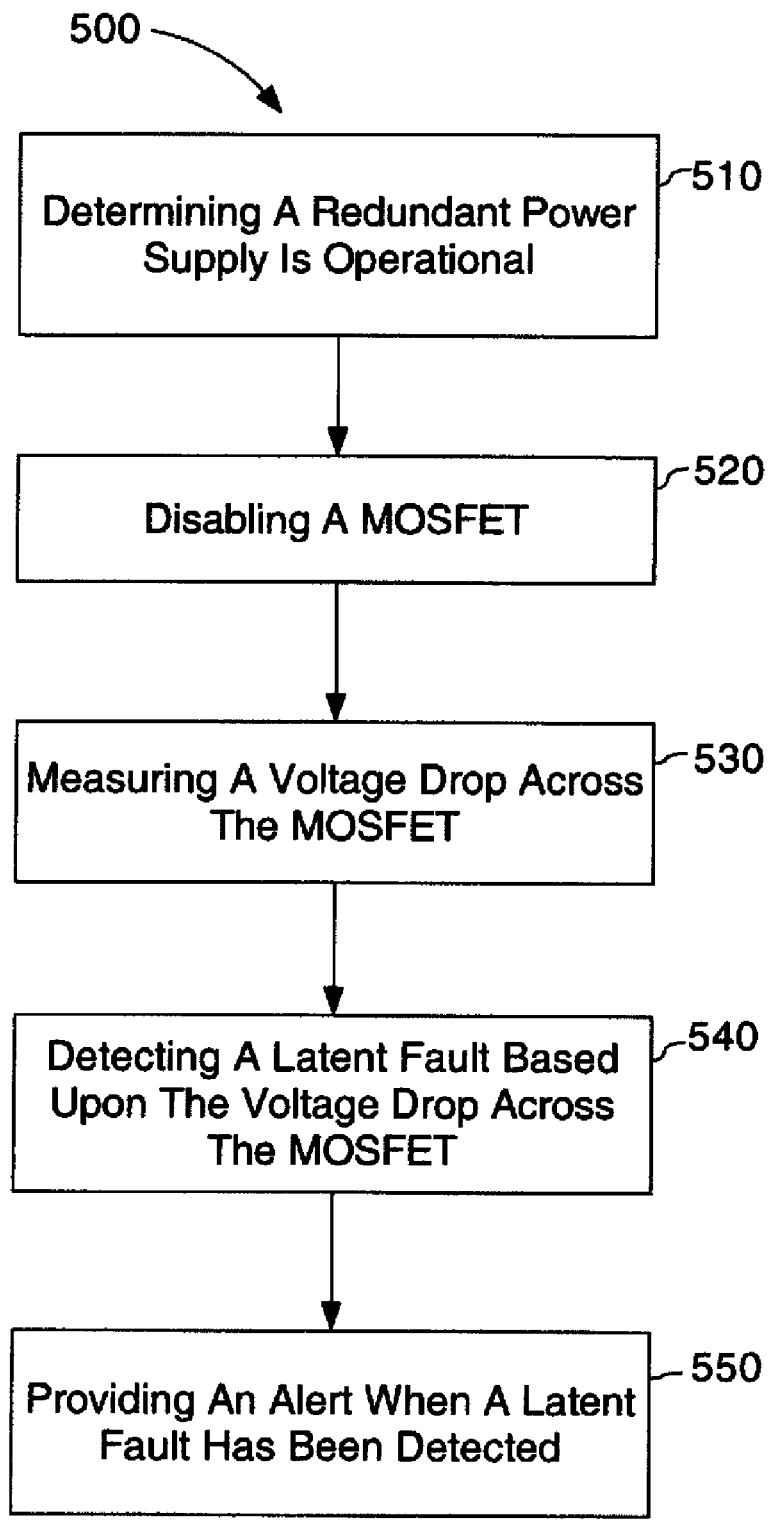
FIG. 5 is a flow diagram representing a method for monitoring latent faults in a power supply system.

Referring to FIG. 5, a flow diagram representing a method 500 for monitoring latent faults in a power supply system is shown. Method 500 may be executed by monitoring system 300, 400 as shown and described in FIGS. 3-4. Method 500 may begin by determining a redundant parallel-connected power supply is operational 510. Determining if a redundant parallel-connected power supply is operational may include receiving a PWR OK signal from another power supply whereby a load may still receive power during the performance of a test for latent faults. Method 500 may include disabling MOSFET 520. Disabling a FET may include removing a voltage to a gate of the MOSFET. Method 500 may include measuring a voltage drop across MOSFET 530. Method 500 may include detecting a latent fault based upon the voltage drop across the MOSFET 540. Detecting a latent fault may be based upon determining a voltage drop is less than a first voltage or greater than a second voltage, the second voltage being a higher voltage than said first voltage. For example, a first voltage may be about 0.3 volts and the second voltage may be about 1 volt. Method 500 may include providing an alert when a latent fault has been detected 550. Providing an alert may be a visual or audio alert in order to notify a user that maintenance may be required.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A power supply system, comprising:
   a first power supply;
   a second power supply;
   a first field effect transistor coupled to said first power supply;
   a second field effect transistor coupled to said second power supply; said first field effect transistor and said second field effect transistor forming an OR FET circuit;
   a first monitoring circuit, said first monitoring circuit configured for detecting a latent fault across said first field effect transistor; and
   a second monitoring circuit, said second monitoring circuit configured for detecting a latent fault across said second field effect transistor, wherein one of said first monitoring circuit and said second monitoring circuit provide an alert when said latent fault has been detected across one of said first field effect transistor and said second field effect transistor.

2. The power supply system as claimed in claim 1, wherein said latent fault includes a short circuit condition and an open circuit condition.

3. The power supply system as claimed in claim 1, wherein said first monitoring circuit measures a voltage drop across said first field effect transistor.

4. The power supply system as claimed in claim 3, wherein said second monitoring circuit measures a voltage drop across said second field effect transistor.

5. The power supply system as claimed in claim 4, wherein said first monitoring circuit includes:
   a first comparator; said first comparator determining if said voltage drop is less than approximately 0.3 volts and a second comparator, said second comparator determining if said voltage drop is greater than approximately 1 volt.

6. The power supply system as claimed in claim 1, wherein said first monitoring circuit is coupled said second monitoring circuit.

7. The power supply system as claimed in claim 6, wherein said first monitoring circuit is coupled to said first power supply.

8. The power supply system as claimed in claim 7, wherein said second monitoring circuit is coupled to said second power supply.

9. The power supply system as claimed in claim 8, wherein said first monitoring circuit provides an alert through a power OK indication of said first power supply when said latent fault has been detected by said first monitoring circuit.

10. The power supply system as claimed in claim 9, wherein said second monitoring circuit provides an alert through a power OK indication of said second power supply when said latent fault has been detected by said second monitoring circuit.

11. A method for detecting latent faults in a power supply system, comprising:
   determining if a parallel connected power supply is operational;
   disabling a MOSFET;
   measuring a voltage drop across the MOSFET;
   detecting a latent fault based upon the voltage drop across the MOSFET; and
   providing an alert when a latent fault is detected.

12. The method as claimed in claim 11, wherein disabling said MOSFET includes removing a voltage from said gate of said MOSFET.

13. The method as claimed in claim 11, wherein said detecting a latent fault includes detecting at least one of a short circuit condition or open circuit condition.

14. The method as claimed in claim 11, wherein said measuring said voltage drop of less than about 0.3 volts across the MOSFET is representative of said latent fault.

15. The method as claimed in claim 14, wherein said measuring said voltage drop of less than about 0.3 volts is representative of a short circuit condition of said MOSFET.

16. The method as claimed in claim 11, wherein said measuring said voltage drop of greater than about 1 volt across the MOSFET is representative of said latent fault.

17. The method as claimed in claim 16, wherein said measuring said voltage drop of greater than about 1 volt is representative of an open circuit condition of said MOSFET.

18. The method as claimed in claim 11, wherein determining if a parallel connected power supply is operational includes receiving a power OK signal from said parallel connected power supply.

19. A power supply system, comprising:
   a power supply;
   a field effect transistor coupled to said power supply, said field effect transistor being configured as an OR FET;
   a monitoring circuit, said monitoring circuit configured for detecting a latent fault across said field effect transistor, wherein said monitoring circuit provides an alert when said latent fault has been detected.

20. The power supply system as claimed in claim 19, wherein said latent fault includes a short circuit condition and an open circuit condition.

21. The power supply system as claimed in claim 19, wherein said monitoring circuit measures a voltage drop across said field effect transistor.

22. The power supply system as claimed in claim 19, wherein said monitoring circuit includes:
   a first comparator; said first comparator determining if said voltage drop is less than approximately 0.3 volts and a second comparator, said second comparator determining if said voltage drop is greater than approximately 1 volt.

23. The power supply system as claimed in claim 22, wherein said monitoring circuit includes a variable voltage source, said variable voltage source temporarily disabling said field effect transistor.

24. The power supply system as claimed in claim 19, wherein said monitoring circuit is coupled to said power supply.

25. The power supply system as claimed in claim 24, wherein said monitoring circuit provides an alert through a power OK indication of said power supply when said latent fault has been detected by said monitoring circuit.

* * * * *